(12) United States Patent
Cheng et al.

(10) Patent No.: US 12,387,928 B2
(45) Date of Patent: Aug. 12, 2025

(54) METHOD FOR MANUFACTURING SEMICONDUCTOR STRUCTURE WITH MATERIAL IN MONOCRYSTALLINE PHASE

(71) Applicant: TAIWAN SEMICONDUCTOR MANUFACTURING COMPANY, LTD., Hsinchu (TW)

(72) Inventors: Kai-Fang Cheng, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 505 days.

(21) Appl. No.: 17/876,036

(22) Filed: Jul. 28, 2022

(65) Prior Publication Data
US 2024/0038528 A1 Feb. 1, 2024

(51) Int. Cl.
| | | |
|---|---|---|
| H01L 21/02 | (2006.01) | |
| C23C 16/30 | (2006.01) | |
| C23C 16/455 | (2006.01) | |
| H01L 21/768 | (2006.01) | |
| H01L 23/522 | (2006.01) | |

(52) U.S. Cl.
CPC ........ *H01L 21/0228* (2013.01); *C23C 16/303* (2013.01); *C23C 16/45553* (2013.01); *H01L 21/02274* (2013.01); *H01L 21/76826* (2013.01); *H01L 21/76834* (2013.01); *H01L 21/76843* (2013.01); *H01L 21/76877* (2013.01); *H01L 23/5226* (2013.01)

(58) Field of Classification Search
CPC ........... H01L 21/0228; H01L 21/02274; H01L 21/76826; H01L 21/76834; H01L 21/76843; H01L 21/76877; H01L 21/76807; H01L 21/76849; H01L 21/76829; C23C 16/303; C23C 16/45553; C23C 16/4554
See application file for complete search history.

(56) References Cited

U.S. PATENT DOCUMENTS

| | | | | |
|---|---|---|---|---|
| 5,208,187 A * | 5/1993 | Tsubouchi | ........ | H01L 21/76883 427/124 |
| 2020/0135552 A1* | 4/2020 | Liou | ........ | H01L 21/76834 |
| 2023/0110947 A1* | 4/2023 | Yamazaki | ........ | C23C 16/45529 118/724 |
| 2023/0178478 A1* | 6/2023 | Hiblot | ........ | H01L 23/481 257/774 |

* cited by examiner

*Primary Examiner* — William B Partridge
*Assistant Examiner* — Gustavo G Ramallo
(74) *Attorney, Agent, or Firm* — Birch, Stewart, Kolasch & Birch, LLP

(57) ABSTRACT

A method for manufacturing a semiconductor structure includes: forming a dielectric layer on a base structure; forming a trench in the dielectric layer to expose the base structure; forming a metal contact in the trench; and performing a plurality of first atomic layer deposition (ALD) cycles to form a plurality of first atomic layers which cover the dielectric layer and the metal contact and which serve as an etch stop layer. Each of the first ALD cycles includes: forming a corresponding one of the first atomic layers; and performing a treatment to convert the corresponding first atomic layer into monocrystalline phase at a temperature not greater than 425° C.

20 Claims, 12 Drawing Sheets

METHOD FOR MANUFACTURING SEMICONDUCTOR STRUCTURE WITH MATERIAL IN MONOCRYSTALLINE PHASE

BACKGROUND

In integrated circuit fabrication, different techniques and/or materials are developed to enhance device performance. For instance, with shrinkage of dimension of the integrated circuit, a reliability issue might occur due to the integrated circuit being undesirably damaged in an etching process. The industry has made lot of efforts to overcome challenges continually encountered in the integrated circuit fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
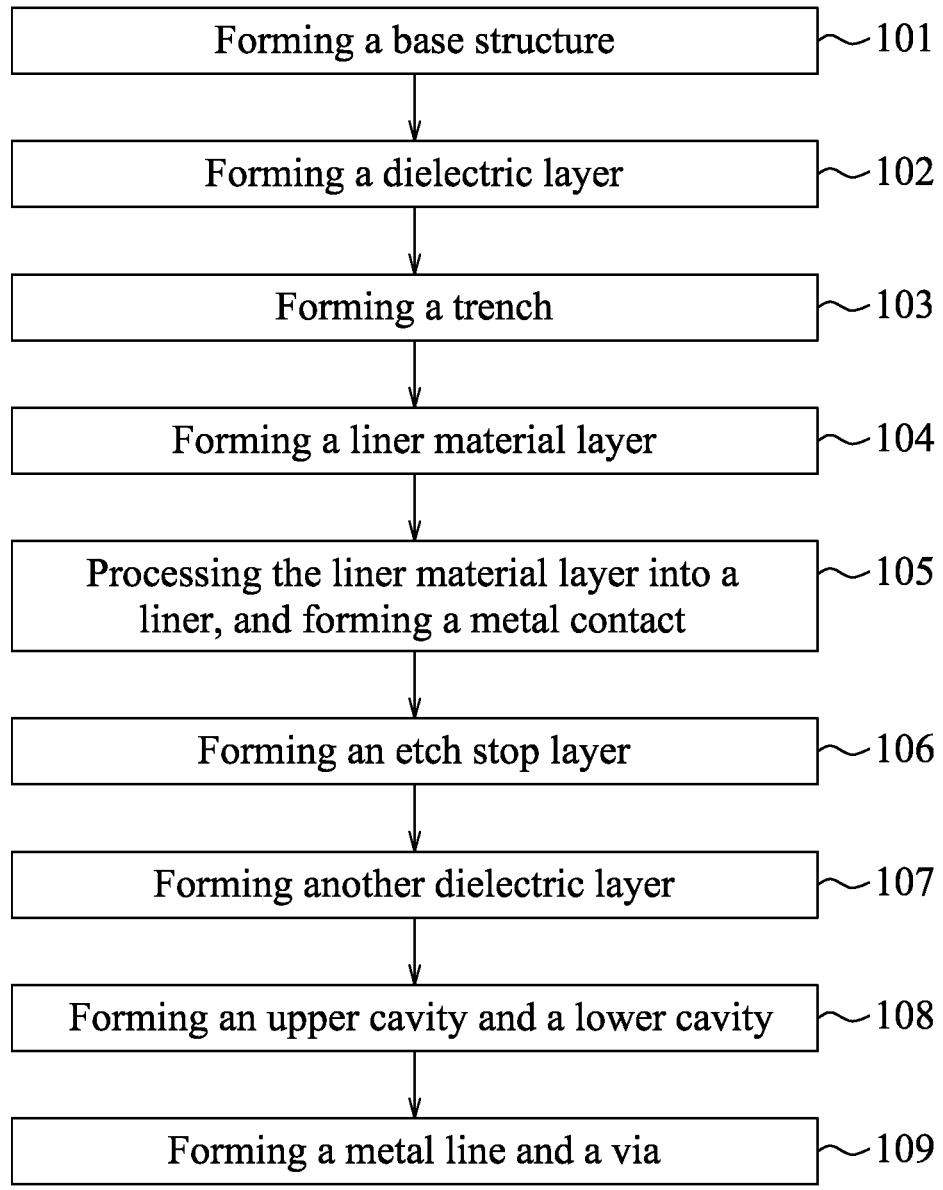
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor structure which includes formation of a liner and/or an etch stop layer that is (are) made of a material in monocrystalline phase, and a method to manufacture such semiconductor structure. The method described in the present disclosure may be a part of a back-end-of-line (BEOL) process flow, in which interconnect structures are formed to be electrically connected to different elements within the semiconductor structure. A maximum temperature limitation for the BEOL process is approximately 425° C. For example, in some cases, if a deposition or treatment in the BEOL process is performed at a temperature higher than about 425° C., the semiconductor device formed in a front-end-of-line (FEOL) process may be undesirably damaged. Therefore, in order to meet the maximum temperature limitation for the BEOL process, in some embodiments, throughout the method for manufacturing the semiconductor structure, the steps described are controlled at a temperature lower than about 425° C. The material for a liner and/or an etch stop layer is formed by an atomic layer deposition (ALD) process which includes a plurality of ALD cycles. Each of the ALD cycles forms an atomic layer, and thus a plurality of atomic layers are obtained after the ALD process. In each of the ALD cycles, a corresponding one of the atomic layers formed is subjected to a treatment so as to be converted into monocrystalline phase. The treatment can be conducted at a relatively low temperature, such as not greater than approximately 425° C., and therefore is applicable in the BEOL process. Other suitable applications for forming the atomic layers in monocrystalline phase are within the contemplated scope of the present disclosure. In the following content, aluminum nitride is used as an example to illustrate an exemplary application for formation of the atomic layers in monocrystalline phase and the advantages thereof, but is not limited thereto. In some embodiments, the atomic layers are made of aluminum nitride, and the liner and/or an etch stop layer may include the aluminum nitride in monocrystalline phase.

FIG. 1 is a flow diagram illustrating the method for manufacturing a semiconductor structure (for example, a semiconductor structure 100 shown in FIG. 11) in accordance with some embodiments. Referring to FIG. 11, the semiconductor structure 100 exemplarily includes two interconnect structures $M_x$ and $M_{x+1}$ that are sequentially formed on a base structure 1. The number of the interconnect structures may be determined according to practical needs. FIGS. 2, 4 to 14 illustrate schematic views of the intermediate stages of the method in accordance with some embodiments. Some repeating portions and/or other portions in FIGS. 2, 4 to 14 are omitted for the sake of brevity. Additional steps can be provided before, after or during the method, and some of the steps described herein may be replaced by other steps or be eliminated.

Figure 2:
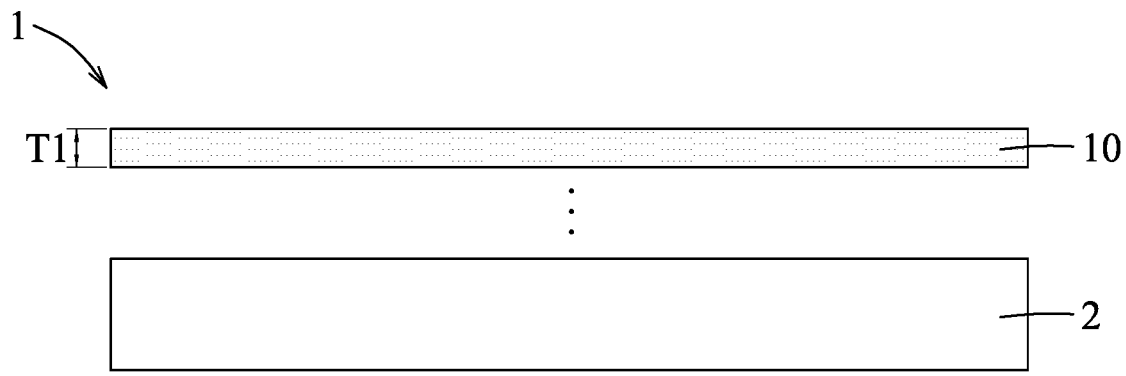
FIGS. 2, and 4 to 14 are schematic views illustrating intermediate stages of the method for manufacturing the semiconductor device in accordance with some embodiments.

Referring to FIG. 1, and the example illustrated in FIG. 2, the method begins at step 101, where the base structure 1 is formed. In some embodiments, the base structure 1 includes a substrate 2, a plurality of semiconductor devices prepared in a front-end-of-line (FEOL) process (not shown) disposed on the substrate 2, at least one interconnect structure (not shown) formed on the semiconductor devices opposite to the substrate 2, and an etch stop layer 10 disposed on the interconnect structure opposite to the semiconductor devices. Other suitable elements for the base structure 1 are within the contemplated scope of the present disclosure.

The substrate 2 may be a silicon-on-insulator (SOI) substrate, a germanium-on-insulator (GOI) substrate, a bulk semiconductor substrate (e.g., a bulk silicon substrate). Other suitable substrate material for forming the substrate 2 are within the contemplated scope of the present disclosure.

There is no limitation on the type of semiconductor devices included in the semiconductor structure 100. The semiconductor devices may include active devices (for example, transistors, or the like), passive devices (for example, capacitors, resistors, or the like), decoders, amplifiers, other suitable devices, and combinations thereof.

The at least one interconnect structure may include an interlayer dielectric (ILD) feature (not shown) in which electrically conductive elements (not shown, for example, metal contacts, metal lines and/or metal vias) are formed so as to permit the semiconductor devices in the base structure 1 to be electrically connected to external circuits through the electrically conductive elements. In some embodiments, each of the electrically conductive elements may be made of electrically conductive materials, such as tungsten (W), aluminum (Al), copper (Cu), ruthenium (Ru), molybdenum (Mo), alloys thereof, or combinations thereof, but is not limited thereto. In some embodiments, the ILD feature may be made of a dielectric material, such as, but not limited to, silicon oxide, silicon nitride, silicon oxynitride, other suitable materials, or combinations thereof, and has an upper surface horizontally flush with that of the electrically conductive elements to facilitate subsequent formation of a BEOL structure thereon.

The semiconductor devices, the electrically conductive elements and the ILD feature on the substrate 1 may be formed using processes known to those skilled in the art of semiconductor fabrication, and thus details thereof are omitted for the sake of brevity.

In some embodiments, the etch stop layer 10 is included on an uppermost part of the base structure 1 so as to prevent any etching process performed subsequently from damaging the elements beneath the etch stop layer 10. In some embodiments, the etch stop layer 10 may include silicon carbide ($SiC_x$), silicon nitride ($SiN_x$), silicon carbide nitride ($SiC_xN_y$), silicon oxynitride ($SiO_xN_y$), aluminum oxynitride ($AlO_xN_y$), aluminum nitride ($AlN_x$) or aluminum oxide ($AlO_x$), and may be doped with hafnium (Hf), zirconium (Zr), or yttrium (Y) formed using a chemical vapor deposition (CVD) process, an ALD process or a spin coating process. In other embodiments, the etch stop layer 10 includes an aluminum nitride layer that is in monocrystalline phase.

Figure 3:
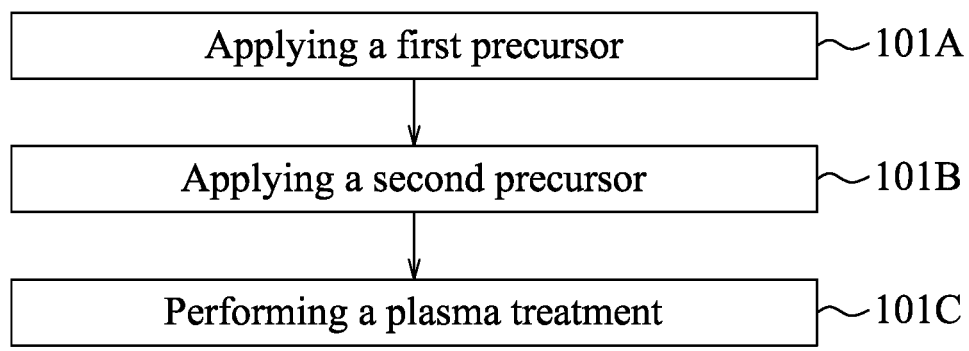
FIG. 3 is another flow diagram illustrating a method for preparing an aluminum nitride layer that is in monocrystalline phase in accordance with some embodiments.

FIG. 3 is a flow diagram illustrating a method for preparing the aluminum nitride layer that is in monocrystalline phase using the ALD process in accordance with some embodiments.

In some embodiments, prior to the ALD process, a growing surface (not shown) on which the aluminum nitride is to be formed thereon is first subjected to a pre-clean process using, for example but not limited to, hydrofluoric acid. The growing surface may be an upper surface of the at least one interconnect structure opposite to the substrate 2. In other embodiments, the pre-clean process is a RCA standard clean process. Other suitable reagents and/or processes for pre-cleaning the growing surface are within the contemplated scope of the present disclosure.

The ALD process includes a plurality of ALD cycles for forming a plurality of atomic layers of aluminum nitride, and each of the ALD cycles includes sub-steps 101A to 101C shown in FIG. 3. Each of the ALD cycles starts at sub-step 101A, where a first precursor is applied over the growing surface. In some embodiments, the application of the first precursor lasts for about 0.3 seconds to about 0.5 seconds, so as to allow sufficient amount of time for the first precursor to chemisorb onto the growing surface. Then, in sub-step 101B, a second precursor is applied over the growing surface to react with the first precursor, thereby forming a corresponding one of the atomic layers of aluminum nitride. The application of the second precursor lasts for about 5 seconds to about 20 seconds, so as to allow sufficient amount of time for reaction between the first and second precursors. In some embodiments, the first precursor is, for example but not limited to, trimethylaluminium ($Al(CH_3)_3$), and the second precursor is, for example, but not limited to, ammonia, or nitrogen together with hydrogen. Other suitable materials for the first and/or second precursors are within the contemplated scope of the present disclosure. In some embodiments, the ALD process is a thermal ALD process. In other embodiments, the ALD process is a plasma enhanced ALD (PEALD) which is advantageous for having a fast reaction rate. In PEALD, the second precursor is applied in form of precursor plasma generated using a plasma power ranging from about 200 W to about 2000 W. Other suitable methods, and/or conditions for applying the first and second precursors are within the contemplated scope of the present disclosure.

In some embodiments, after application of the first and/or second precursors (i.e., in-between sub-steps 101A and 101B and/or in-between sub-steps 101B and 101C), a purging gas including, for example, but not limited to, nitrogen and/or argon is applied over the growing surface for about 8 seconds to about 10 seconds so as to remove any $Al(CH_3)_3$ residue, and/or ammonia residue remaining on the growing surface. Other suitable purging gases and/or conditions for applying the purging gases are within the contemplated scope of the present disclosure.

In some embodiments, when the aluminum nitride deposition is applied in a BEOL process, the entire ALD process is conducted at a temperature not greater than about 425° C., such as about 300° C. to about 425° C., so as to meet the temperature limitation for the BEOL process. In addition, a pressure in the ALD cycles may range from about 100 mTorr to about 500 mTorr. The corresponding atomic layer of aluminum nitride formed after sub-step 101B of each of the ALD cycles is most likely in polycrystalline phase, i.e., aluminum nitride grains within the atomic layer are formed with different orientations.

Referring to FIG. 3, in sub-step 101C, the corresponding atomic layer of aluminum nitride formed in polycrystalline phase is then subjected to a treatment so as to be converted into monocrystalline phase.

In some embodiments, the treatment is a plasma treatment. The plasma used is formed from a precursor which includes at least one of argon and helium. In some embodiments, the precursor includes argon, hydrofluoric acid and helium. In such precursor, argon induces conversion of polycrystalline aluminum nitride into monocrystalline phase; hydrofluoric acid further enhances the conversion process; and helium serves as a dilution element in the plasma to adjust a concentration of argon in the plasma so as to ensure the corresponding atomic layer of aluminum nitride to be converted into monocrystalline phase. Depending on different tools used for the ALD process, each of argon, hydrofluoric acid and helium is present in different concentration, or is delivered at different flow rate. In some other embodiments, the precursor for forming the plasma may include ammonia and helium that are present in a predetermined concentration ratio so as to convert the corresponding atomic layer of aluminum nitride into monocrystalline phase. Other suitable reagents and/or processes for converting polycrystalline aluminum nitride into monocrystalline aluminum nitride are within the contemplated scope of the present disclosure.

In some embodiments, the plasma in sub-step 101C is generated under a power ranging from about 100 W to about 200 W. In some embodiments, the plasma treatment is conducted for a time period ranging from about 1 second to about 3 seconds. Such time period allows sufficient amount of time for the conversion process without damaging other elements of the base structure 1. The plasma treatment may be conducted at temperature same as the deposition process. After the plasma treatment, the ALD cycle shown in FIG. 3 is completed, and the corresponding atomic layer of aluminum nitride in polycrystalline phase is converted into monocrystalline phase. By performing more ALD cycles, a plurality of the atomic layers of aluminum nitride that are in monocrystalline phase are formed to cooperatively form the aluminum nitride layer.

In some embodiments, when the etch stop layer 10 includes a monocrystalline aluminum nitride layer, the etch stop layer 10 may have a thickness (T1) not greater than about 30 Å, so as to keep capacitance level as low as possible. In some embodiments, the thickness (T1) may ranges from about 1 Å to about 30 Å.

Referring to FIGS. 4 to 7, steps 102 to 105 demonstrate formation of the interconnect structure $M_x$ using, for example, but not limited to, a single damascene process. The interconnect structure $M_x$ may include one or a plurality of metal contacts 50' formed in a dielectric layer 20. Other suitable elements for the interconnect structure $M_x$ and/or processes for forming the interconnect structure $M_x$ are within the contemplated scope of the present disclosure.

Figure 4:
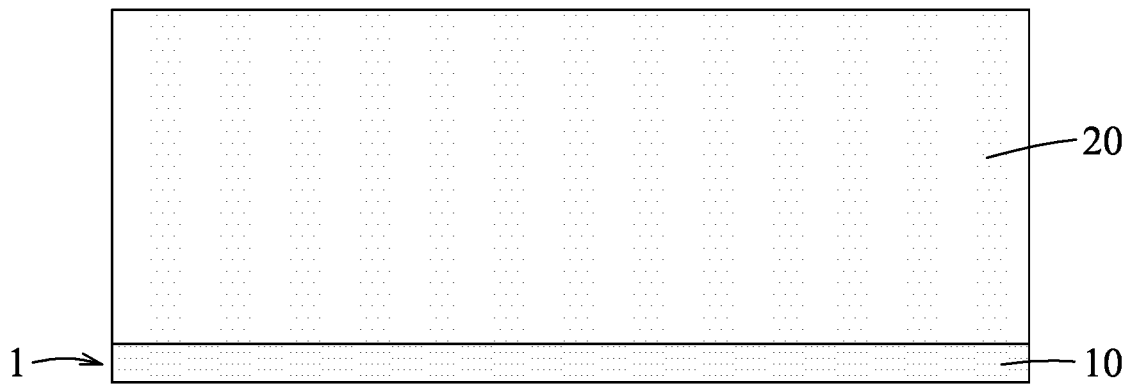

Referring to FIG. 1, and the example illustrated in FIG. 4, the method proceeds to step 102, where the dielectric layer 20 is formed on the etch stop layer 10 of the base structure 1.

In some embodiments, the dielectric layer 20 includes a low dielectric constant (low-k) material which has a dielectric constant ranging from about 1.0 to about 4.0. Examples of the low-k material include silicon carbon nitride ($SiC_xN_y$), boron carbon nitride ($BC_xN_y$), silicon oxide ($SiO_x$), silicon nitride ($SiN_x$), silicon carbide ($SiC_x$), silicon oxycarbide ($SiO_xC_y$), silicon oxynitride ($SiO_xN_y$), hydrogenated silicon oxycarbide ($SiO_xC_yH_z$), spin-on glass (SOG), amorphous fluorinated carbon, fluorinated silica glass (FSG), xerogel, aerogel, polyimide, parylene, bis-benzocyclobutenes, non-porous materials, porous materials, or combinations thereof. The dielectric layer 20 made of $SiC_xN_y$ has a dielectric constant ranging from about 2.0 to about 4.0, and can be prepared from, for example, but not limited to, tetramethylsilane ($Si(CH_3)_4$) with ammonia ($NH_3$), or silane ($SiH_4$) with $NH_3$ and ethene ($C_2H_4$) using CVD or ALD process, and optionally followed by an annealing process, a plasma post treatment or a ultraviolet (UV) process. The dielectric layer 20 made of $BC_xN_y$ has a dielectric constant ranging from about 1.0 to about 3.0, and can be prepared from, for example, but not limited to, triethyl borate (TEB) with $NH_3$ using CVD or ALD process and optionally followed by an annealing process, a plasma post treatment or a UV process. Other suitable materials and/or processes and/or conditions for forming the dielectric layer 20 are within the contemplated scope of the present disclosure.

Figure 5:
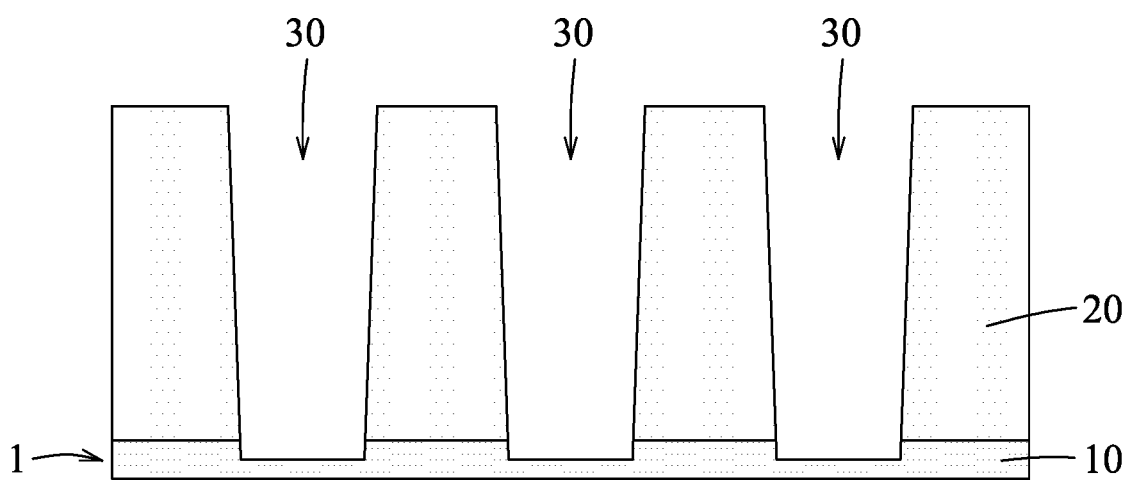

Referring to FIG. 1, and the example illustrated in FIG. 5, the method proceeds to step 103, where a trench 30 is formed in the dielectric layer 20 to expose the etch stop layer 10 of the base structure 1. In some embodiments, as shown in FIG. 5, three trenches 30 are formed, but are not limited thereto. The number of the trenches 30 formed may be determined according to practical needs.

In some embodiments, step 103 includes sub-steps of: (i) depositing a hard mask material (not shown) over the dielectric layer 20 shown in FIG. 4; (ii) forming a patterned photoresist layer (not shown) on the hard mask material to expose portions of the hard mask material in positions corresponding to the trenches 30 to be formed; and (iii) removing the exposed hard mask material and the dielectric layer 20 beneath using for example, but not limited to, a wet etching process, a dry etching process, thereby forming the trenches 30. Such removal of the dielectric layer 20 terminates in the etch stop layer 10 as shown in FIG. 5, or terminates on upper surface of the etch stop layer 10 (i.e., an interface between the etch stop layer 10 and the dielectric layer 20 shown in FIG. 4). In some cases, when the trenches 30 are intended to accommodate the metal contacts 50' (see FIG. 7) that are electrically connected to, for example, but not limited to, the electrically conductive elements in the at least one interconnect structure of the base structure 1, the trenches 30 may also extend through the etch stop layer 10, i.e., removal of the dielectric layer 20 terminates until the trenches 30 penetrate through the etch stop layer 10. Please note that, the hard mask material, material for forming the patterned photoresist layer, and reagent(s) used in removing the etching process may be any suitable chemicals. Other suitable processes for forming the trenches 30 are within the contemplated scope of the present disclosure.

Figure 6:
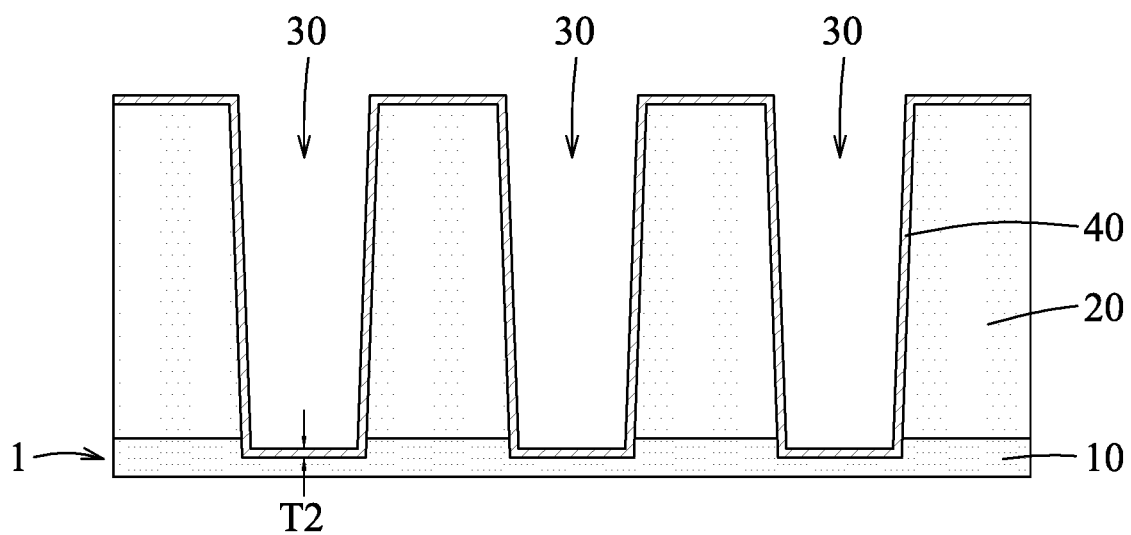

Referring to FIG. 1, and the example illustrated in FIG. 6, the method proceeds to step 104, where a liner material layer 40 is conformally formed over the dielectric layer 20, the trenches 30 and the etch stop layer 10.

Figure 7:
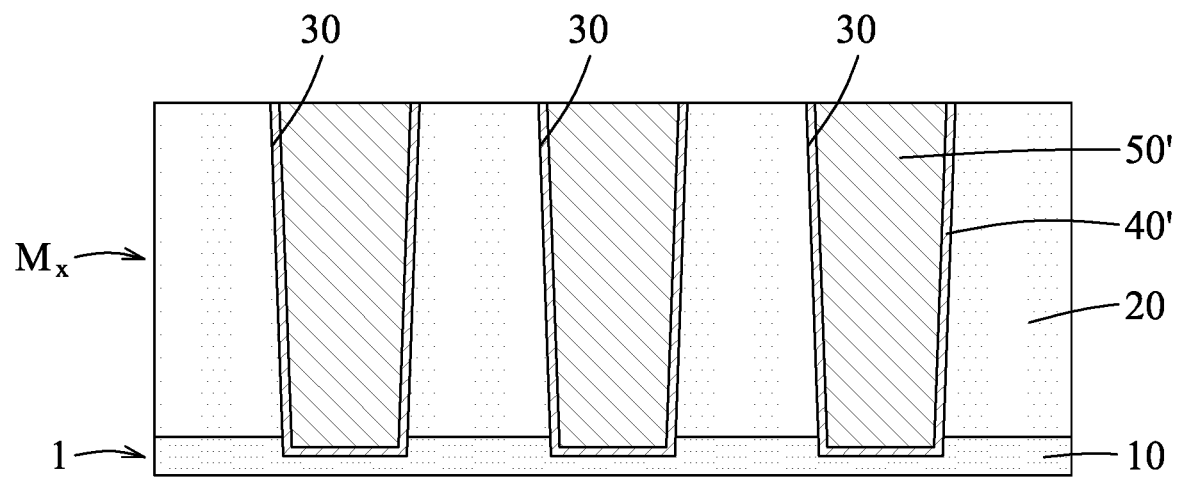

The liner material layer 40 is to be further processed in step 105 so as to form liners 40' shown in FIG. 7. Each of the liners 40' is a barrier layer to avoid diffusion of material of one of the metal contacts 50' (see also FIG. 7) into the dielectric layer 20. Considering that resistance of the liners 40' is ideally kept as low as possible so as to ensure performance of the semiconductor structure 100 (see FIG. 11), material for the liner material layer 40 is carefully determined. In some embodiments, the liner material layer 40 includes an aluminum nitride layer that is in monocrystalline phase, and that is formed in a manner similar to that of the etch stop layer 10 prepared in step 101. Details of the formation of the liner material layer 40 is omitted for the sake of brevity. In some embodiments, the liner material layer 40 has a thickness (T2) not greater than about 30 Å. Since a pitch between the semiconductor devices is relatively small, the liner 40' is also formed as thin as possible. Compared with other liner material such as tantalum or tantalum nitride, aluminum nitride made of aluminum nitride that is in monocrystalline phase is conducive to lower contact resistance. In some embodiments, the thickness (T2) may range from about 1 Å to about 30 Å.

Referring to FIG. 1, and the example illustrated in FIG. 7, the method proceeds to step 105, where one of the metal contacts 50' and a corresponding one of the liners 40' are formed in each of the trenches 30.

In some embodiments, step 105 includes sub-step of: (i) forming a metal contact material layer 50 (not shown, which is to form the metal contact 50') over the liner material layer 40 obtained in step 104; and (ii) performing a planarization process, for example, but not limited to, a chemical-mechanical planarization (CMP) process, to remove a portion of the metal contact material layer 50 and a portion of the liner material layer 40, until the dielectric layer 20 are exposed.

In sub-step (i), in some embodiments, the metal contact material layer 50 includes copper (Cu), nickel (Ni), cobalt (Co), ruthenium (Ru), iridium (Ir), aluminum (Al), platinum (Pt), palladium (Pd), gold (Au), silver (Ag), osmium (Os), tungsten (W), molybdenum (Mo), or combinations thereof. In some embodiments, the metal contact material layer 50 is formed using an ALD process, a CVD process, a physical vapor deposition (PVD) process, an electroless plating (ELD) process, or an electrochemical plating (ECP) process. Other suitable materials and/or processes for forming the metal contact material layer 50 are within the contemplated scope of the present disclosure.

By completing the sub-step (ii), the metal contacts 50' and the liners 40' are formed and each of the metal contacts 50' is separated from the dielectric layer 20 by a corresponding one of the liners 40'. The number of the metal contacts 50' and the number of the liners 40' are determined by the number of the trenches 30. After step 105, the dielectric layer 20 may be referred to as an inter-metal dielectric (IMD) layer.

Figure 8:
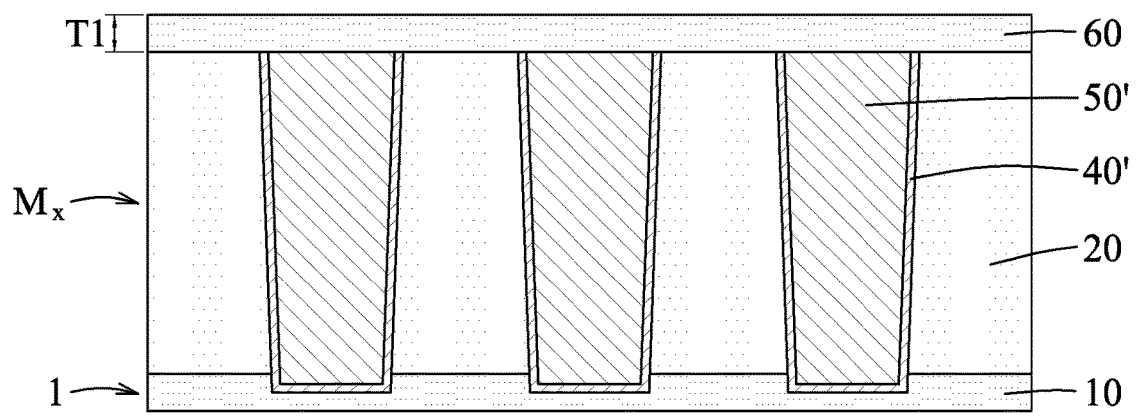

Referring to FIG. 1, and the examples illustrated in FIGS. 7 and 8, the method proceeds to step 106, where an etch stop layer 60 is formed on the interconnect structure $M_x$. The etch stop layer 60 formed in step 106 is to protect the interconnect structure $M_x$ from damages due to any subsequent etching processes. The etch stop layer 60 formed in step 106 is similar to the etch stop layer 10 of the base structure 1 formed in step 101, and the details thereof are omitted for the sake of brevity.

Figure 9:
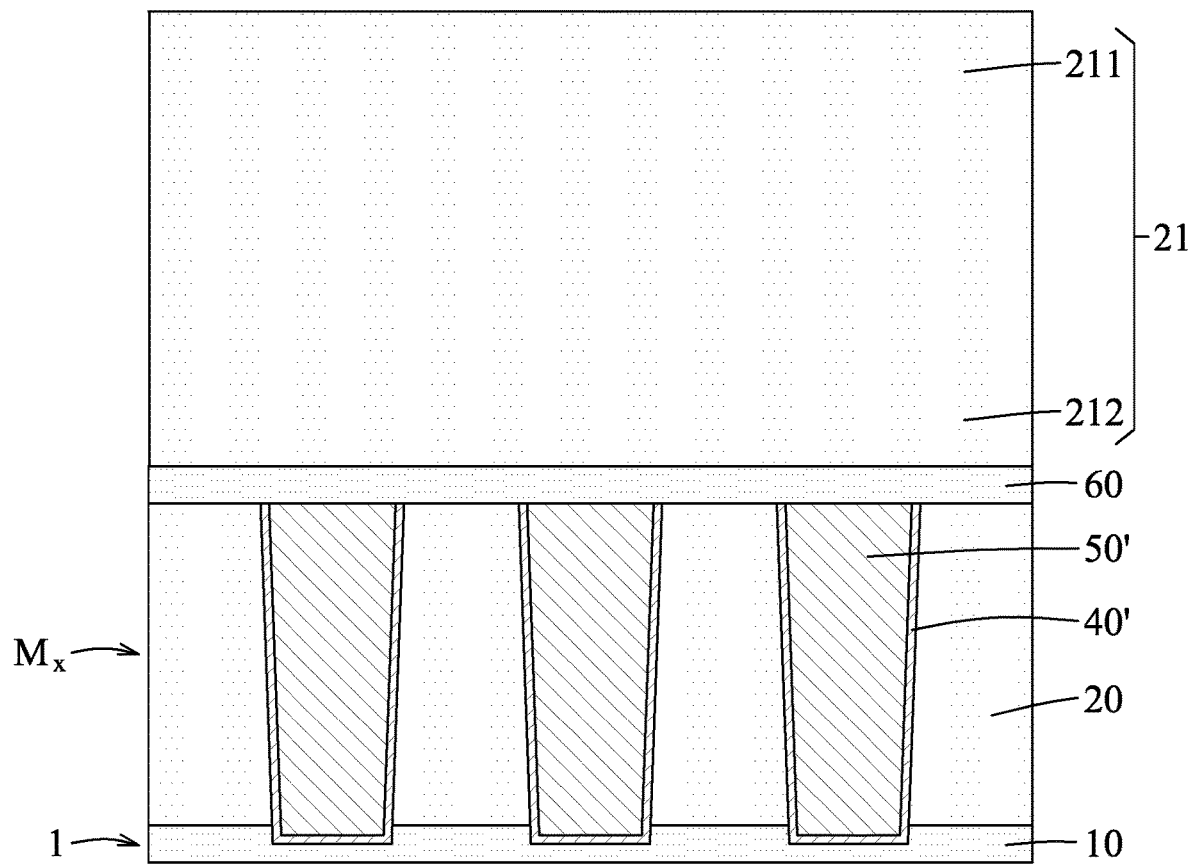
Figure 10:
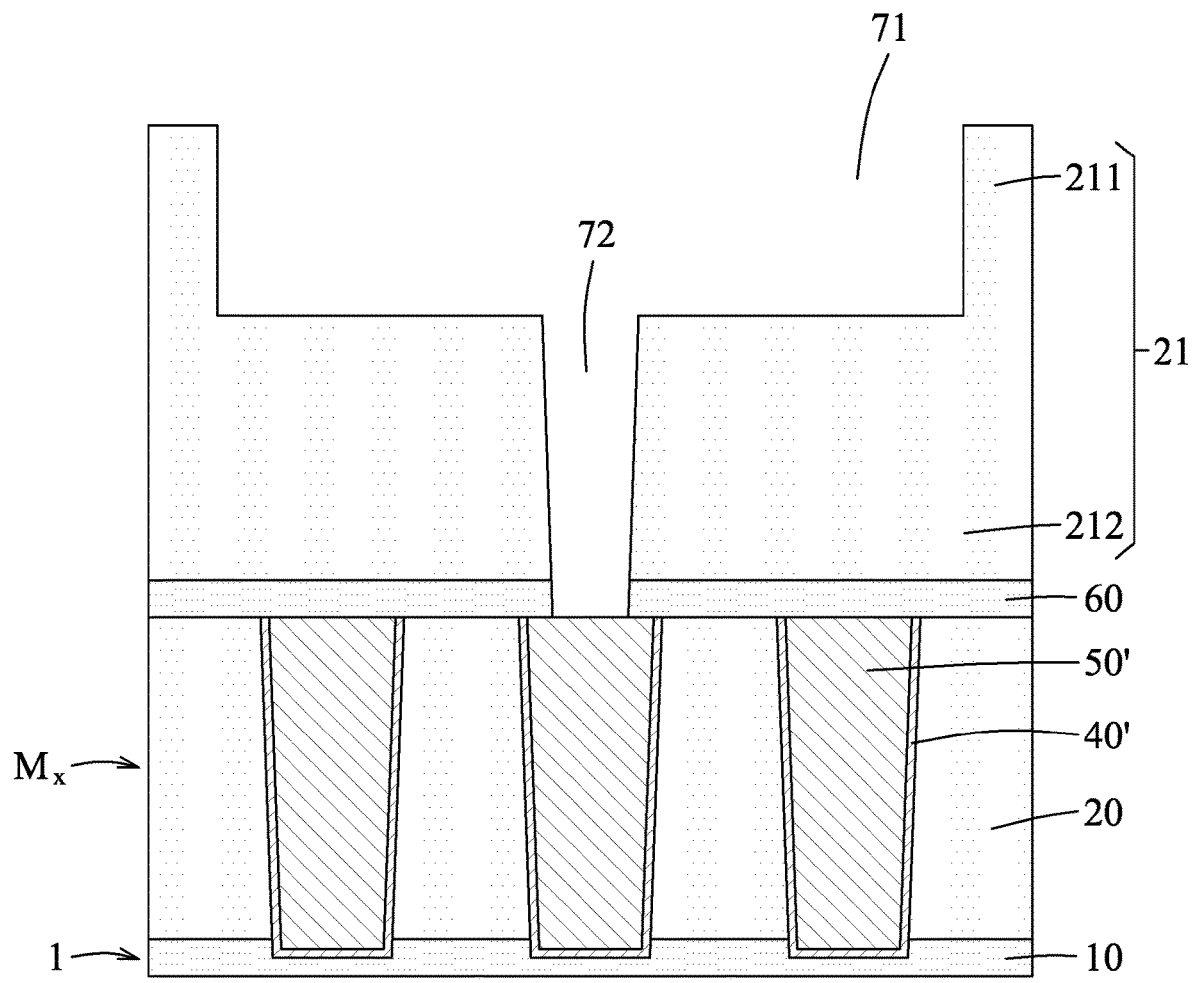
Figure 11:
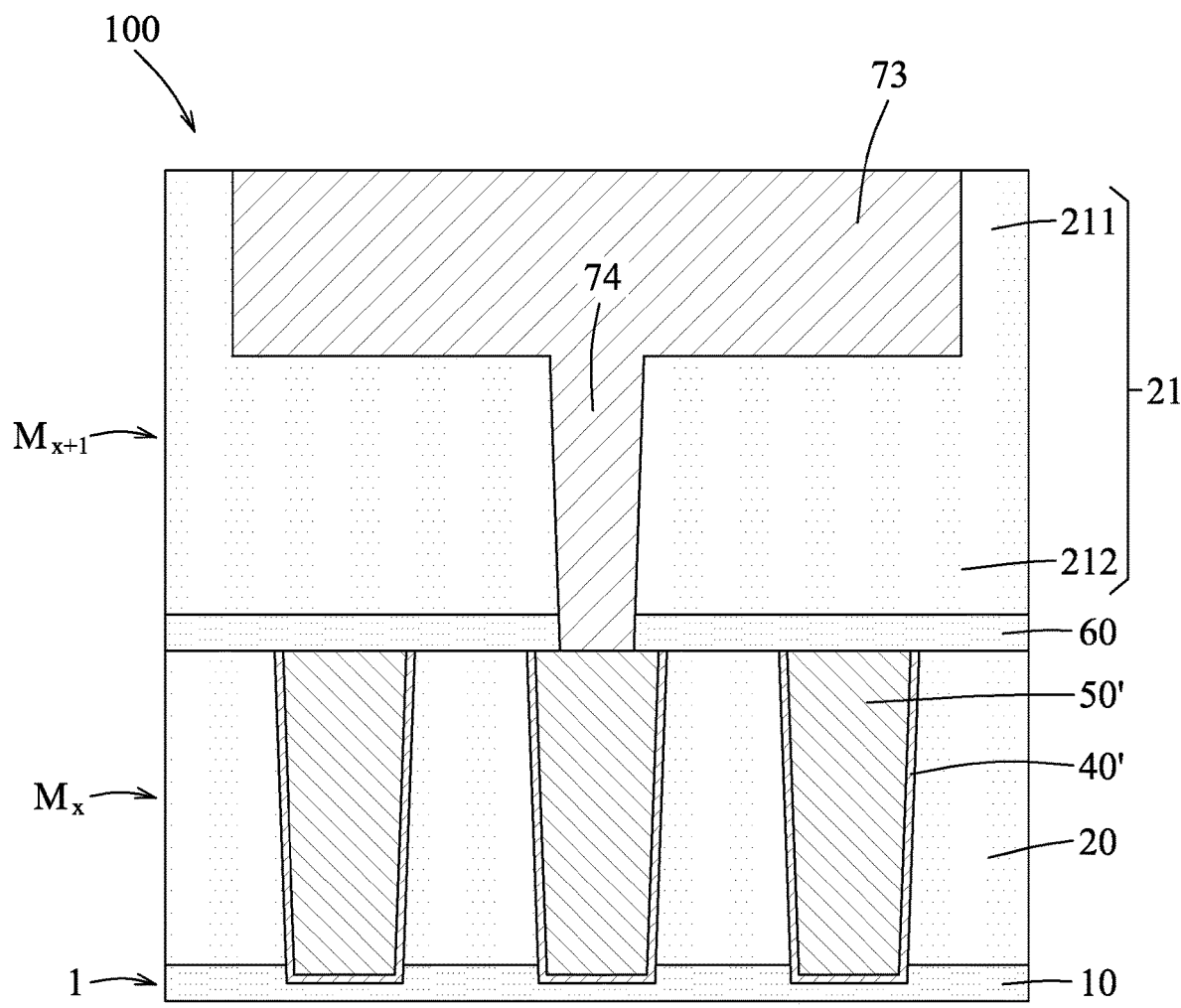

Referring to FIGS. 9 to 11, steps 107 to 109 demonstrate formation of the interconnect structure $M_{x+1}$ using, for example but not limited to, a dual damascene process. Referring to FIG. 11, in some embodiments, the interconnect structure $M_{x+1}$ includes a metal line 73 and a via 74 formed in a dielectric layer 21. Other suitable elements for the interconnect structure $M_{x+1}$ and/or processes for forming the interconnect structure $M_{x+1}$ are within the contemplated scope of the present disclosure.

Referring to FIG. 1, and the example illustrated in FIG. 9, the method proceeds to step 107, where the dielectric layer 21 of the interconnect structure $M_{x+1}$ is formed over the structure shown in FIG. 8. The dielectric layer 21 formed in step 107 is similar to the dielectric layer 20 formed in step 102, and the details thereof are omitted for the sake of brevity. In some embodiments, the dielectric layer 21 formed in step 107 has an upper portion 211 and a lower portion 212 which are separated by a not-shown etch stop layer (which is also similar to the etch stop layer 10 of step 101) so as to facilitate the dual damascene process.

Referring to FIG. 1, and the example illustrated in FIG. 10, the method proceeds to step 108, where an upper cavity 71 is formed in the upper portion 211 of the dielectric layer 21, and a lower cavity 72 is formed in the lower portion 212 of the dielectric layer 21. In some embodiments, the upper cavity 71 has a dimension larger than that of the lower cavity 72.

In some embodiments, the upper and lower cavities 71, 72 are formed by patterning the dielectric layer 21 by one or more etching processes (for example, but not limited to, a dry etching process, a wet etching process, or a combination thereof) similar to the details described in step 103 so as to expose one of the metal contacts 50' through the upper and lower cavities 71, 72. The upper cavity 71 is recessed downwardly from a top surface of the upper portion 211 of the dielectric layer 21. The lower cavity 72 extends through the not-shown etch stop layer (formed in step 107), the lower portion 212 of the dielectric layer 21 and the etch stop layer 60 (formed in step 106), and is disposed below and spatially communicated with the upper cavity 71.

Referring to FIG. 1, and the example illustrated in FIG. 11, the method proceeds to step 109, where the metal line 73 is formed in the upper cavity 71 and the via 74 is formed in the lower cavity 72.

In some embodiments, the metal line 73 and the via 74 may independently include a material similar to that of the metal contacts 50', and the details thereof are omitted for the sake of brevity.

In some embodiments, an upper liner (not shown) may be formed between the metal line 73 and the upper portion 21, and a lower liner (not shown) may be formed between the via 74 and the lower portion 212. Materials and processes for forming the upper and lower liners may be similar to those for the liners 40', and the details thereof are omitted for the sake of brevity.

By completing step 109, the semiconductor structure 100 of the present disclosure is obtained, and can be further applied in any suitable applications. It should be noted that some steps in the method may be modified, replaced, or eliminated without departure from the spirit and scope of the present disclosure, and those steps may not be in the order mentioned above.

Figure 12:
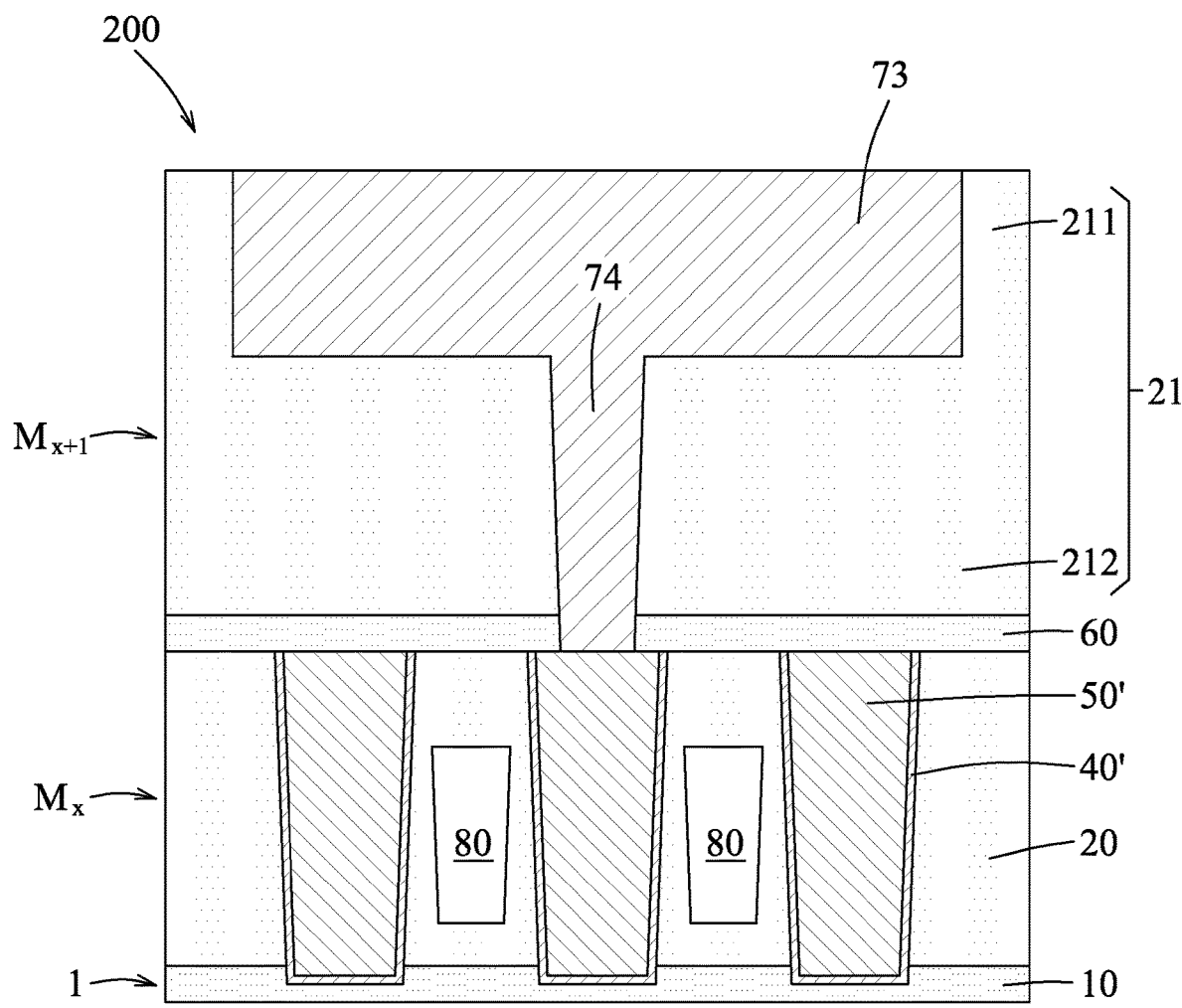

FIG. 12 illustrates a semiconductor structure 200 in accordance with some embodiments. The semiconductor structure 200 is similar to the semiconductor structure 100, except that in the semiconductor structure 200, one or a plurality of air gaps 80 are formed in the dielectric layer 20. In FIG. 12, there are two air gaps 80 formed in the dielectric layer 20 of the interconnect structure $M_x$, each of which is disposed between two corresponding ones of the liners 40'. The air gaps 80 may be formed by any suitable processes.

Figure 13:
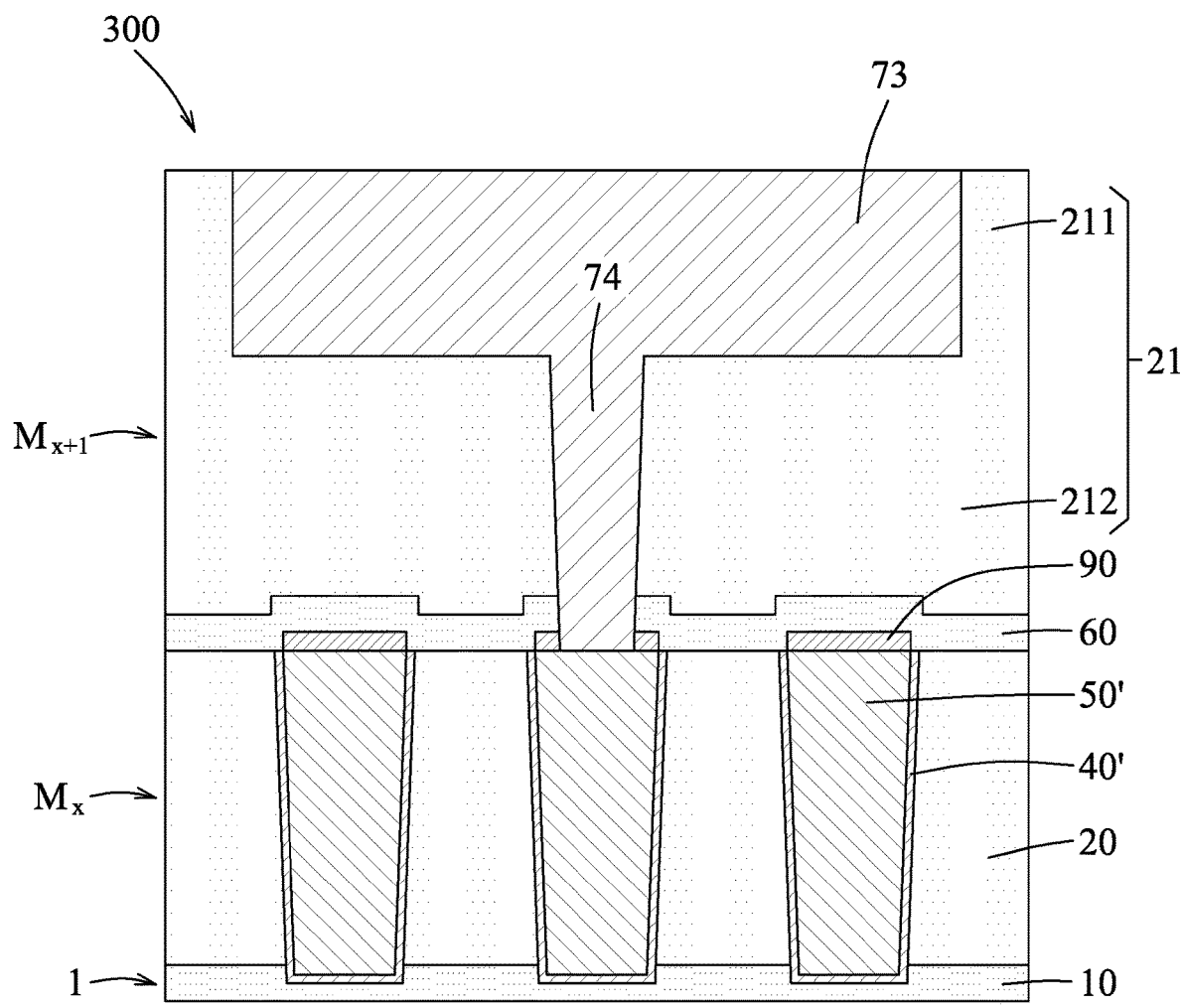

FIG. 13 illustrates a semiconductor structure 300 in accordance with some embodiments. The semiconductor structure 300 is similar to the semiconductor structure 100, except that in the semiconductor structure 300, three cap layers 90, each of which covers a corresponding one of the metal contacts 50' is formed. As such, the cap layers 90 are disposed between the etch stop layer 60 and the metal contacts 50'. In some embodiments, each of the cap layers 90 includes, for example but not limited to, graphene, such that contact resistance may be reduced. Other suitable materials for the cap layers 90 are within the contemplated scope of the present disclosure. In some embodiments, prior to step 106, an additional step is performed for forming the cap layers 90, and includes selectively depositing, e.g., graphene (which is to form the cap layers 90) over the metal contacts 50'. An ammonia treatment is then performed over the graphene surface so as to remove any metal oxides present thereon. Then, proceeding to step 106, the etch stop layer 60 is formed.

Figure 14:
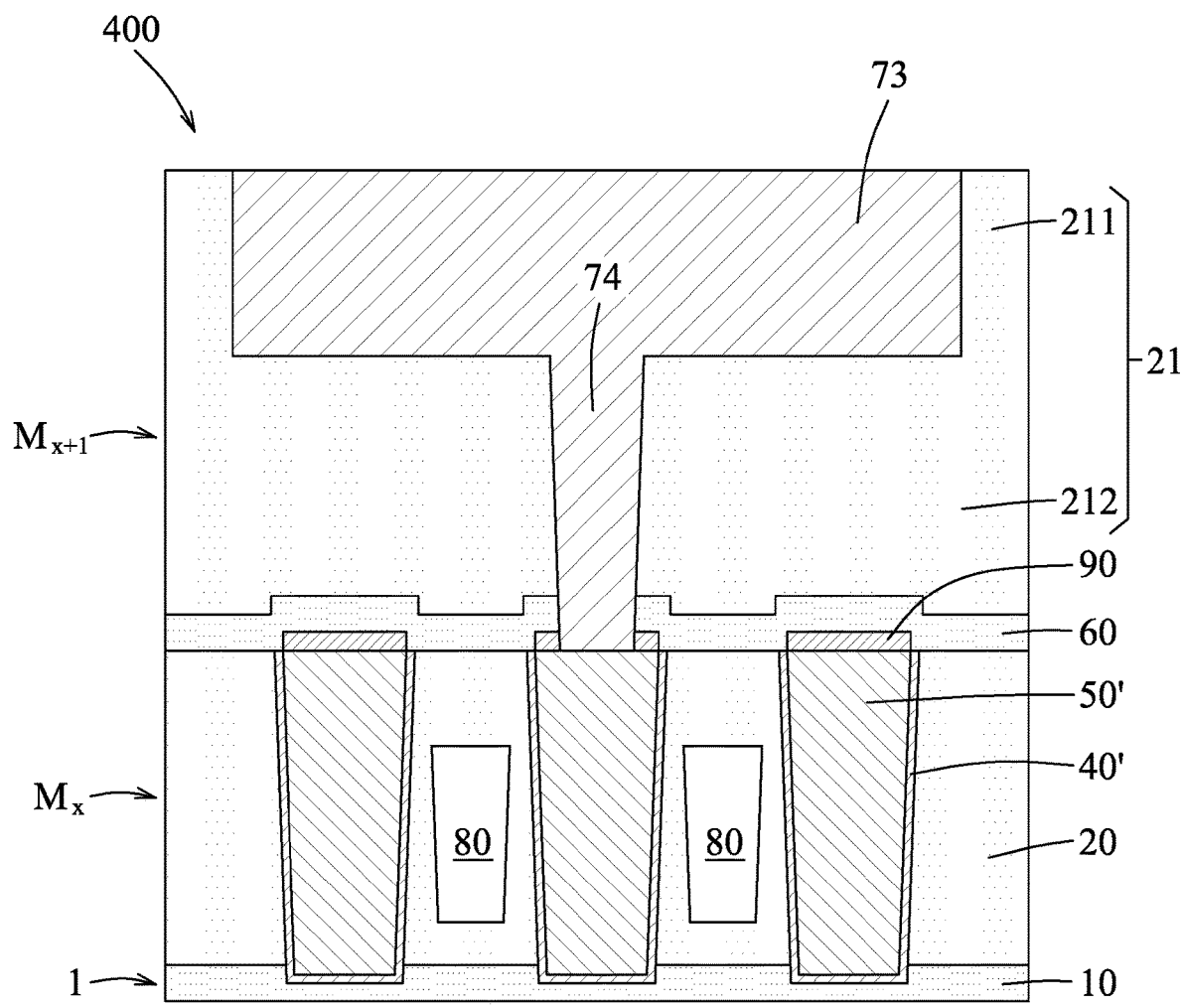

FIG. 14 illustrates a semiconductor structure 400 in accordance with some embodiments. The semiconductor structure 400 is similar to the semiconductor structure 300, except that in the semiconductor structure 400, air gaps 80 as described in the semiconductor structure 200 are also formed.

Please note that in comparison with a polycrystalline material, a monocrystalline material may have improved properties that are beneficial to be applied in fabrication of BEOL structures. For instance, the monocrystalline aluminum nitride may have a thermal conductivity ranging from about 100 W/mK to about 300 W/mK, which is at least 50 times greater than that of the polycrystalline aluminum nitride. In addition, the monocrystalline aluminum nitride may have a density ranging from about 3.5 g/cm$^3$ to about 3.9 g/cm$^3$, which is significantly higher than a density of the polycrystalline aluminum nitride (approximately 2.5 g/cm$^3$ to 2.7 g/cm$^3$). The monocrystalline aluminum nitride of the present disclosure may also be described as hermetic, i.e., when the monocrystalline aluminum nitride of the present disclosure is used to cover, for instance, a metal, the metal may be protected from moisture and/or oxygen so as to avoid oxidation. In addition, the monocrystalline aluminum nitride is also capable of preventing metal materials from diffusing therethrough. In the present disclosure, the monocrystalline aluminum nitride converted from polycrystalline aluminum nitride can serve as different elements of the interconnect structures in the BEOL process, for instance, serving as the etch stop layers 10, 60, and/or the liner 40'.

In terms of the etch stop layers 10, 60, when being subjected to wet etchants, the etch stop layers 10, 60 that are made of monocrystalline aluminum nitride have a selectivity much higher than etch stop layers that are made of silicon-based materials, and thus the etch stop layers 10, 60 may be formed with a much less thickness, so that the semiconductor structures 100, 200, 300, 400 have an advantageous effect of a relatively low capacitance. In addition, in comparison with the etch stop layers that are made of non-monocrystalline aluminum nitride, the etch stop layers 10, 60 that are made of monocrystalline aluminum nitride have a higher thermal conductivity, which allow heat dissipation therethrough to be more efficient. Moreover, it is common for the etch stop layers that are made of non-monocrystalline aluminum nitride to be coupled with an extra cap over each of such etch stop layers so as to improve reliability of the semiconductor structure produced thereby. However, the extra cap made of, for example, but not limited to, silicon oxycarbide, may undesirably increase capacitance of the semiconductor structure, and may undesirably reduce thermal conduction to the dielectric layer. In contrast, in the present disclosure, the etch stop layers 10, 60 that are made of monocrystalline aluminum nitride may readily protect the metal beneath from oxidation without having to be coupled with the extra cap. As such, by having the etch stop layers 10, 60 made of monocrystalline aluminum nitride, instead of non-monocrystalline aluminum nitride coupled with the extra cap, is conducive to keep capacitance as low as possible. Additionally, when the etch stop layers are made of non-monocrystalline material, a metal-based cap layer (for example, but not limited to, a cobalt cap layer) over each of the metal contacts is provided to prevent metals of the metal contacts from diffusing upwardly to etch stop layers and to other elements of the semiconductor structures. In the present disclosure, the etch stop layers 10, 60 may readily prevent metal diffusion, and thus inclusion of the cap layer for the purpose of preventing metal diffusion is optional. Omission of the metal-based cap layers over the metal contacts 50' is conducive to keep contact resistance as low as possible.

In terms of the liners 40', the liners 40' that are made of monocrystalline aluminum nitride have a resistance lower than liners that are made of, for example, but not limited to, tantalum or tantalum nitride, and is conducive to keep contact resistance as low as possible.

In terms of the entire interconnect structures, e.g., $M_x$ and/or $M_{x+1}$, components made of the monocrystalline aluminum nitride, e.g., the etch stop layers 10, 60 and/or the liners 40' when in cooperation with the dielectric layers 20, 21, are conducive to lower capacitance.

Figure 15:
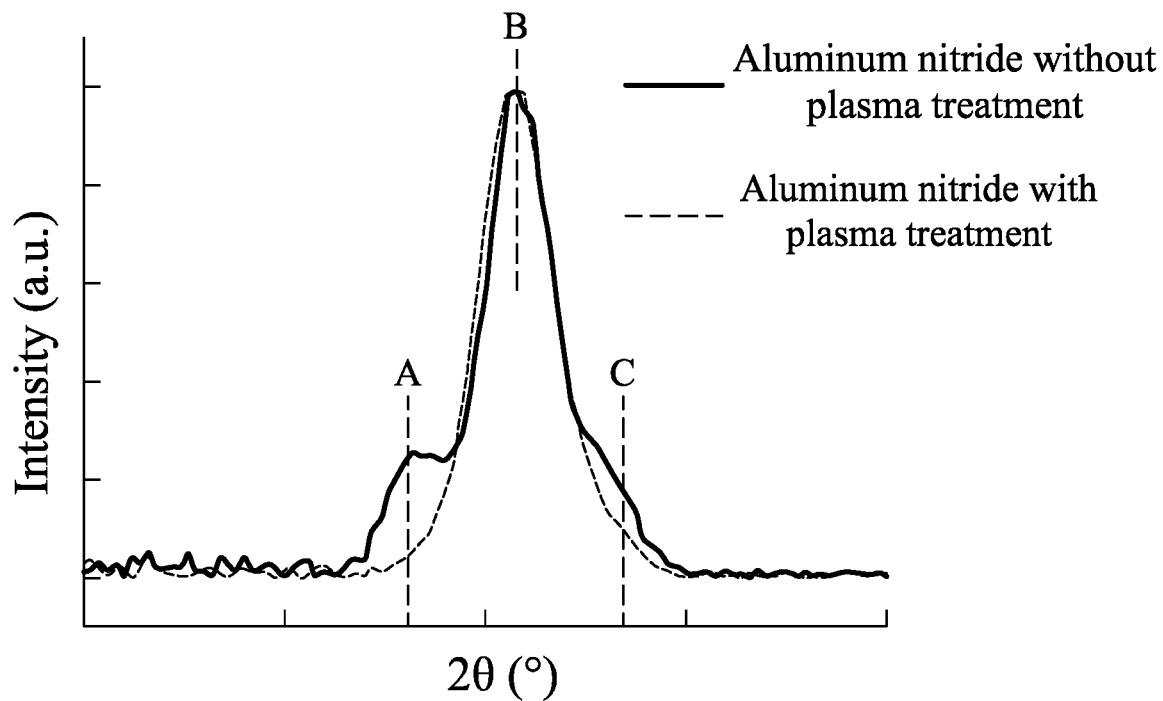
FIG. 15 is a plot of X-ray diffraction patterns of aluminum nitrides respectively formed with and without plasma treatment in accordance with some embodiments.

In order to evaluate the effect of the plasma treatment performed on aluminum nitride, an X-ray diffraction analysis is performed to examine crystal structures of aluminum nitrides respectively formed with and without the plasma treatment, and the results are shown in FIG. 15. For aluminum nitride formed without the plasma treatment, three peaks A, B, C, each of which corresponds to a respective one of planes ((100), (002) and (101) planes in this case) of aluminum nitride, are observed, indicating that aluminum nitride formed without the plasma treatment is polycrystalline, i.e., such aluminum nitride is formed with different orientations. For aluminum nitride formed with the plasma treatment according to the present disclosure, one peak (the peak B) which corresponds to one plane ((002) plane in this case) of aluminum nitride is observed. This indicates that, by including the plasma treatment in each of the ALD cycles, polycrystalline aluminum nitride formed with different orientations ((100), (101) planes in this case) are rearranged into monocrystalline aluminum nitride ((002) plane in this case). Please note that in FIG. 15, the orientation represented by the peak B is a major crystal orientation in aluminum nitride, and the plasma treatment is performed to permit other minor crystal orientations represented by the peaks A and C to be rearranged into the major crystal orientation, thereby obtaining aluminum nitride in monocrystalline phase. In other cases, when any one of the other orientations represented by the peak A or C is a major crystal orientation in aluminum nitride, and the plasma treatment is performed to permit other minor crystal orientations to be rearranged into the major crystal orientation. The parameters for the plasma treatment are adjusted to obtain aluminum nitride in monocrystalline phase. For example, when the plasma power or the precursor concentration (e.g., argon concentration) in sub-step 101C shown in FIG. 3 is too low, the minor crystal orientations might not be rearranged; and when the plasma power or the precursor concentration (e.g., argon concentration) in sub-step 101C is too high, the major crystal orientations might also be damaged to form even more crystal orientations.

Figure 16:
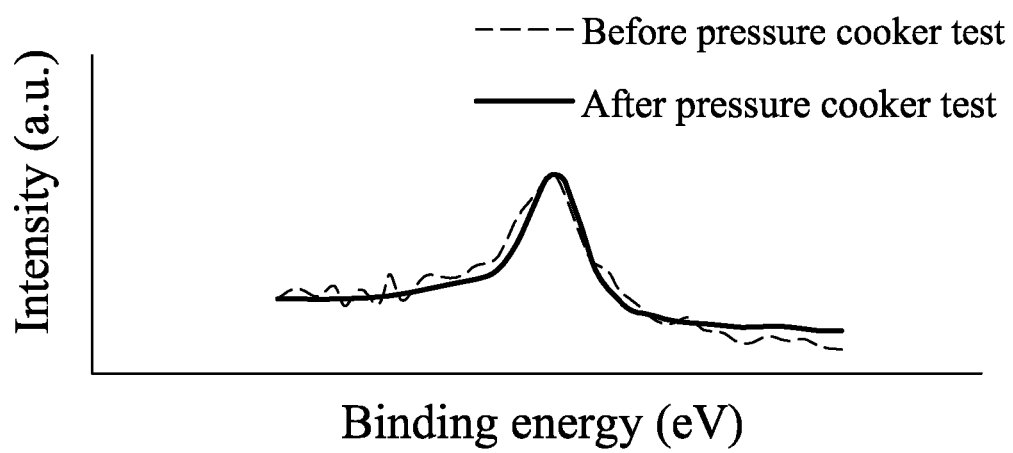
FIG. 16 is a plot of binding energies of copper of an aluminum nitride/copper stack before and after being subjected to a pressure cooker test in accordance with some embodiments.

The monocrystalline aluminum nitride is also examined for its protective effect against oxidation. Two stacks, each including a sample of monocrystalline aluminum nitride stacked on a piece of copper, are prepared. The sample of monocrystalline aluminum nitride has a thickness not greater than 30 Å, and is prepared in accordance with the method of the present disclosure. One of the stacks is subjected to a pressure cooker test, which is conducted at 120° C. under a humidity of 100% for 24 hours. Binding energies of copper of the stack before and after the pressure cooker test are determined and shown in FIG. 16. As shown in FIG. 16, positions of the peaks of the curves obtained before and after the pressure cooker test are similar, indicating that no moisture penetrates through the monocrystalline aluminum nitride to reach and react with the copper beneath.

Figure 17:
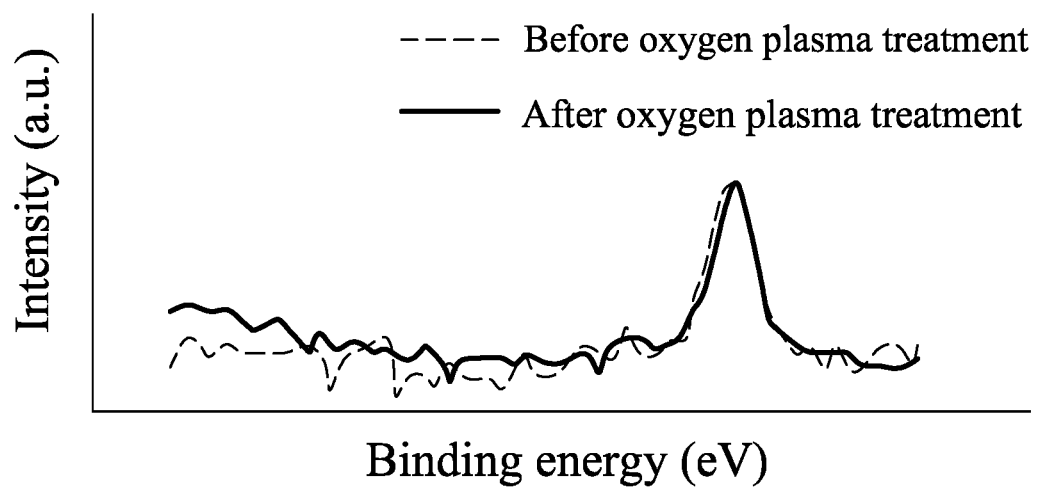
FIG. 17 is a plot of binding energies of copper of the aluminum nitride/copper stack before and after being subjected to on oxygen treatment in accordance with some embodiments.

Another one of the stacks is subjected to an oxygen plasma treatment, so as to examine if the monocrystalline aluminum nitride can protect the copper against oxidation under the application of oxygen plasma. Binding energies of copper of the stack before and after the oxygen plasma treatment are determined and shown in FIG. 17. As shown in FIG. 17, positions of the peaks of the curves obtained before and after the oxygen plasma treatment are similar, indicating that under the application of the oxygen plasma, which is considered as a more aggressive approach to induce oxidation of copper than the condition used in the pressure cooker test, still, no significant oxidation is induced and observed. Thus, the monocrystalline aluminum nitride prepared according to the disclosure, may effectively protect metal, e.g., metal such as copper, or metals suitable for forming the metal contacts 50', the metal line 73 and the via 74, against oxidation.

The embodiments of the present disclosure have the following advantageous features. By virtue of including a treatment in each ALD cycles, aluminum nitride formed is converted to monocrystalline aluminum nitride which has many superior properties, such as improved thermal conductivity, and being capable of protecting metal from oxidation due to e.g., oxygen and/or moisture. Thus, such monocrystalline aluminum nitride is suitable to serve as etch stop layers and/or liners in semiconductor structures, and is conducive to keep capacitance, and/or contact resistance low.

In accordance with some embodiments of the present disclosure, a method for manufacturing a semiconductor structure includes: forming a dielectric layer on a base structure; forming a trench in the dielectric layer to expose the base structure; forming a metal contact in the trench; and performing a plurality of first atomic layer deposition (ALD) cycles to form a plurality of first atomic layers which cover the dielectric layer and the metal contact and which serve as an etch stop layer. Each of the first ALD cycles includes: forming a corresponding one of the first atomic layers; and performing a treatment to convert the corresponding first atomic layer into monocrystalline phase at a temperature not greater than 425° C.

In accordance with some embodiments of the present disclosure, the first atomic layers are made of aluminum nitride, and in each of the first ALD cycles, the treatment is performed to convert aluminum nitride so as to obtain the corresponding first atomic layer of aluminum nitride in monocrystalline phase.

In accordance with some embodiments of the present disclosure, the treatment is performed using a plasma.

In accordance with some embodiments of the present disclosure, a precursor for generating the plasma includes at least one of argon and helium.

In accordance with some embodiments of the present disclosure, the precursor further includes hydrofluoric acid.

In accordance with some embodiments of the present disclosure, when the precursor includes helium, the precursor further includes ammonia.

In accordance with some embodiments of the present disclosure, the plasma is generated using a plasma power ranging from 100 W to 200 W.

In accordance with some embodiments of the present disclosure, the method further includes forming a liner on an inner surface of the trench such that after forming the metal contact, the liner is disposed between the metal contact and the dielectric layer.

In accordance with some embodiments of the present disclosure, the liner is formed by performing a plurality of second ALD cycles to form a plurality of second atomic layers. Each of the second ALD cycles includes: forming a corresponding one of the second atomic layers on the inner surface of the trench; and performing a treatment to convert the corresponding second atomic layer into monocrystalline phase at a temperature not greater than 425° C.

In accordance with some embodiments of the present disclosure, the method further includes forming a cap layer which includes graphene and which covers the metal contact such that after forming the etch stop layer, the cap layer is disposed between the etch stop layer and the metal contact.

In accordance with some embodiments of the present disclosure, the method further includes forming an air gap in the dielectric layer.

In accordance with some embodiments of the present disclosure, a method for manufacturing a semiconductor structure includes: forming a dielectric layer on the base structure; forming a trench in the dielectric layer to expose the base structure; performing a plurality of atomic layer deposition (ALD) cycles to form a plurality of atomic layers which cover an inner surface of the trench and which serve as a liner; and forming a metal contact in the trench, the metal contact being separated from the dielectric layer by the liner. Each of the ALD cycles includes: forming a corresponding one of the atomic layers on the inner surface of the trench; performing a treatment to convert the corresponding atomic layer into monocrystalline phase at a temperature not greater than 425° C.

In accordance with some embodiments of the present disclosure, the atomic layers are made of aluminum nitride, and in each of the ALD cycles, the treatment is performed to convert aluminum nitride so as to obtain the corresponding atomic layer of aluminum nitride in monocrystalline phase.

In accordance with some embodiments of the present disclosure, the treatment is performed using a plasma.

In accordance with some embodiments of the present disclosure, a precursor for generating the plasma includes at least one of argon and helium.

In accordance with some embodiments of the present disclosure, the precursor further includes hydrofluoric acid.

In accordance with some embodiments of the present disclosure, a semiconductor structure includes: a base structure; a dielectric layer; a metal contact disposed in and exposed from the dielectric layer; and an etch stop layer that covers the dielectric layer and the metal contact. The etch stop layer is made of a first material in monocrystalline phase.

In accordance with some embodiments of the present disclosure, the first material is aluminum nitride.

In accordance with some embodiments of the present disclosure, the semiconductor further includes a liner disposed between the metal contact and the dielectric layer. The liner is made of a second material in monocrystalline phase.

In accordance with some embodiments of the present disclosure, the second material is aluminum nitride.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a dielectric layer on a base structure;

forming a trench in the dielectric layer to expose the base structure;

forming a metal contact in the trench; and performing a plurality of first atomic layer deposition (ALD) cycles to form a plurality of first atomic layers which cover the dielectric layer and the metal contact and which serve as an etch stop layer, each of the plurality of first ALD cycles including:

forming a corresponding one of the plurality of first atomic layers; and performing a treatment to convert a phase of the corresponding one of the plurality of first atomic layers into a monocrystalline phase at a temperature not greater than 425° C.

2. The method according to claim 1, wherein the plurality of first atomic layers are made of aluminum nitride, and in each of the plurality of first ALD cycles, the treatment is performed to convert a phase of aluminum nitride so as to obtain the corresponding one of the plurality of first atomic layers of aluminum nitride in a monocrystalline phase.

3. The method according to claim 1, wherein the treatment is performed using a plasma.

4. The method according to claim 3, wherein a precursor for generating the plasma includes at least one of argon and helium.

5. The method according to claim 4, wherein the precursor further includes hydrofluoric acid.

6. The method according to claim 4, wherein when the precursor includes helium, the precursor further includes ammonia.

7. The method according to claim 3, wherein the plasma is generated using a plasma power ranging from 100 W to 200 W.

8. The method according to claim 1, further comprising forming a liner on an inner surface of the trench such that after forming the metal contact, the liner is disposed between the metal contact and the dielectric layer.

9. The method according to claim 8, wherein the liner is formed by performing a plurality of second ALD cycles to form a plurality of second atomic layers, each of the plurality of second ALD cycles including:

forming a corresponding one of the plurality of second atomic layers on the inner surface of the trench; and performing a treatment to convert a phase of the corresponding one of the plurality of second atomic layers into a monocrystalline phase at a temperature not greater than 425° C.

10. The method according to claim 1, further comprising forming a cap layer which includes graphene and which covers the metal contact such that after forming the etch stop layer, the cap layer is disposed between the etch stop layer and the metal contact.

11. The method according to claim 1, further comprising forming an air gap in the dielectric layer.

12. A method for manufacturing a semiconductor structure, comprising:

forming a dielectric layer on the base structure;

forming a trench in the dielectric layer to expose the base structure;

performing a plurality of atomic layer deposition (ALD) cycles to form a plurality of atomic layers which cover an inner surface of the trench and which serve as a liner, each of the plurality of ALD cycles including:

forming a corresponding one of the plurality of atomic layers on the inner surface of the trench; and performing a treatment to convert a phase of the corresponding one of the plurality of atomic layers into a monocrystalline phase at a temperature not greater than 425° C.; and forming a metal contact in the trench, the metal contact being separated from the dielectric layer by the liner.

13. The method according to claim 12, wherein the plurality of atomic layers are made of aluminum nitride, and in each of the plurality of ALD cycles, the treatment is performed to convert a phase of aluminum nitride so as to obtain the corresponding one of the plurality of atomic layers of aluminum nitride in a monocrystalline phase.

14. The method according to claim 12, wherein the treatment is performed using a plasma.

15. The method according to claim 14, wherein a precursor for generating the plasma includes at least one of argon and helium.

16. The method according to claim 15, wherein the precursor further includes hydrofluoric acid.

17. A method for manufacturing a semiconductor structure, comprising:

forming a dielectric layer on a base structure;

forming a trench in the dielectric layer;

forming a liner in the trench;

forming a metal contact in the trench over the liner; and forming an etch stop layer over the metal contact and the dielectric layer, formation of at least one of the liner and the etch stop layer including performing a plurality of first atomic layer deposition (ALD) cycles, each of which includes forming an atomic layer of a material in a non-monocrystalline phase and converting the material from the non-monocrystalline phase into a monocrystalline phase.

18. The method of claim 17, wherein the material is aluminum nitride.

19. The method of claim 17, wherein forming the atomic layer of the material in the non-monocrystalline phase includes applying a first precursor for a first predetermined time period, the first precursor including aluminum, and after applying the first precursor, applying a second precursor for a second predetermined time period which is longer than the first predetermined time period, the second precursor including nitrogen.

20. The method of claim 19, wherein forming the atomic layer of the material in the non-monocrystalline phase further includes introducing a purging gas after applying the first precursor or after applying the second precursor.

* * * * *